(12) United States Patent
Atanackovic

(10) Patent No.: US 7,018,484 B1
(45) Date of Patent: Mar. 28, 2006

(54) SEMICONDUCTOR-ON-INSULATOR SILICON WAFER AND METHOD OF FORMATION

(75) Inventor: Peter B. Atanackovic, Palo Alto, CA (US)

(73) Assignee: Translucent Inc., Palo Alto, CA (US)

( * ) Notice: Subject to any disclaimer, the term of this patent is extended or adjusted under 35 U.S.C. 154(b) by 0 days.

(21) Appl. No.: 11/054,573

(22) Filed: Feb. 9, 2005

(51) Int. Cl.
H01L 29/02 (2006.01)
H01L 21/58 (2006.01)

(52) U.S. Cl. ..................... 148/33.3; 438/459
(58) Field of Classification Search ............... 438/406, 438/455–459, 977, FOR 107, FOR 246, 438/FOR 477, FOR 485; 148/DIG. 12, 148/33.3; 257/E21.122, E21.123
See application file for complete search history.

(56) References Cited

U.S. PATENT DOCUMENTS

| 6,114,188 A * | 9/2000 | Oliver et al. ............... 438/107 |
| 6,645,830 B1 * | 11/2003 | Shimoda et al. ............ 438/455 |
| 6,818,530 B1 * | 11/2004 | Shimoda et al. ............ 438/455 |
| 2003/0224582 A1 * | 12/2003 | Shimoda et al. ............ 438/458 |
| 2005/0095815 A1 * | 5/2005 | Bojarczuk et al. .......... 438/459 |

* cited by examiner

*Primary Examiner*—George Fourson
(74) *Attorney, Agent, or Firm*—Parsons & Goltry; Robert A. Parsons; Michael W. Goltry

(57) ABSTRACT

A method of fabricating a semiconductor-on-insulator semiconductor wafer is described that includes providing first and second silicon substrates. A first thin layer of silicon dioxide is formed on one substrate and a second thicker layer of silicon dioxide is formed on the other substrate. A layer of rare earth is deposited, generally by evaporation, on the thicker layer of silicon dioxide. The rare earth layer is placed on the thin silicon dioxide layer and the structure is bonded by annealing to form a layer of rare earth silicon dioxide. A portion of the one substrate is removed to form a thin crystalline active layer on preferably the rare earth silicon dioxide layer, but potentially on the thicker silicon dioxide layer.

18 Claims, 3 Drawing Sheets

SEMICONDUCTOR-ON-INSULATOR SILICON WAFER AND METHOD OF FORMATION

FIELD OF THE INVENTION

This invention relates to crystalline semiconductor on an insulator layer for use in the semiconductor industry.

BACKGROUND OF THE INVENTION

In the semiconductor industry it is common to form a layer of crystalline silicon (generally referred to as an active layer) on an insulating layer to reduce any effects or interactions between the substrate (or handle wafer) on one side of the insulating layer and components formed on or in the crystalline layer on the other side of the insulating layer. At the present time the preferred insulating layer is formed of silicon dioxide ($SiO_2$) because of the ease in forming the layer and because bonding between the silicon dioxide and the silicon of the handle wafer is easy to achieve. In this disclosure the term "crystalline silicon" is used to denote a layer of silicon that is substantially single crystal material, i.e. as much of a single crystal as can be formed using present day techniques.

One common method of forming a silicon dioxide insulating layer between a substrate and a crystalline silicon layer is to provide two silicon substrates and form a layer of silicon dioxide on the surface of one of the substrate. At present the film of silicon dioxide is almost always formed by thermal oxidation, i.e. heating the substrate in a high humidity (such as steam). The silicon dioxide surface is then brought into contact with the surface of the second silicon substrate and forms a molecular bond through a well known process, referred to in the industry as Van der Waal's bonding. One of the substrates is then partially removed by any of several different methods to leave a thin crystalline layer of silicon on the silicon dioxide layer. This in effect forms a buried oxide (BOX) insulator layer.

One method of removing a substantial portion of the substrate is to implant hydrogen, which is then annealed to form a weakened fracture plane. The substrate is then cleaved at the fracture plane and the surface is polished to a mirror surface using well known chemical mechanical polishing (CMP) techniques. Some methods have been introduced to improve the cleaving and polishing, see for example U.S. Pat. No. 6,372,609, entitled "Method of Fabricating SOI Wafer by Hydrogen ION Delamination Method and Wafer Fabricated by the Method", issued Apr. 16, 2002.

One problem with the crystalline silicon on a silicon dioxide insulating layer is the strain produced by stress introduced at the junction by the lattice mismatch between the silicon and the thermally formed silicon dioxide. The lattice mismatch results in a relatively high compressive stress at the junction between the two materials. In many instances this high stress can result in dislocations, crystalline defects, and even fractures in the active layer. Some components can be formed in the crystalline layer that use this compressive stress to an advantage, however, since the compressive stress will be across the entire wafer it will affect all components formed in/on the crystalline layer, many to a highly undesirable degree. To provide an unstressed or unstrained active layer, the thickness of the silicon dioxide layer must be severely limited to a thickness at which the stress substantially disappears. That is, in each atomic layer of the silicon dioxide a small amount of the stress can be removed by lattice matching until, ultimately, all stress is removed (stress distribution). However, the result is a layer of silicon dioxide that is too thick to be of use in many applications, such as gate oxides in very small field effect transistors and the like.

Also, because the silicon dioxide layer allows some migration of impurities into the active layer from the substrate (handle wafer) both of the substrates must be high quality wafers, which adds substantial expense. Further, the silicon dioxide may contain impurities (e.g. hydrogen molecules introduced during the oxidation process) that can migrate into the active layer.

It would be highly advantageous, therefore, to remedy the foregoing and other deficiencies inherent in the prior art.

Accordingly, it is an object of the present invention to provide new and improved semiconductor-on-insulator semiconductor wafers.

Another object of the invention is to provide a new and improved semiconductor-on-insulator semiconductor wafer with one or more insulating layers to produce a relatively stress free active layer.

Another object of the invention is to provide new and improved semiconductor-on-insulator semiconductor wafers that can be formed very thin.

And another object of the invention is to provide new and improved semiconductor-on-insulator semiconductor wafers with an insulating layer that prevents impurities from migrating into the active layer.

Still another object of the present invention is to provide new and improved semiconductor-on-insulator semiconductor wafers that can be formed with a less expensive handle wafer.

SUMMARY OF THE INVENTION

Briefly, to achieve the desired objects of the instant invention in accordance with a preferred embodiment thereof, provided is a method of fabricating a semiconductor-on-insulator semiconductor wafer that includes providing first and second semiconductor substrates. A first insulating layer is formed on the first substrate and a second insulating layer is formed on the second substrate. A layer of rare earth is deposited on the surface of either the first or the second insulating layer. The structure is annealed to produce a molecular interaction between the rare earth layer and the other of the insulating layers to form an amorphous insulating layer bonding the first substrate to the second substrate. A portion of one substrate is removed to form a thin crystalline active layer on preferably the rare earth silicon dioxide layer, but potentially on the thicker silicon dioxide layer.

A semiconductor-on-insulator semiconductor wafer is formed by a preferred embodiment of the new method that includes first and second silicon substrates with a thin silicon dioxide layer formed on the first substrate and a thicker silicon dioxide layer formed on the second substrate. A layer of rare earth is deposited, generally by evaporation or the like, on the thicker silicon dioxide layer. The rare earth layer is positioned on the thinner silicon dioxide layer and the structure is annealed to produce a molecular interaction between the rare earth layer and the thinner silicon dioxide layer to form an amorphous rare earth silicon dioxide layer bonding the first substrate to the second substrate. A portion of one of the semiconductor substrates is removed to form a thin crystalline active layer on, preferably, the rare earth silicon dioxide layer, but potentially on the thicker silicon dioxide layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
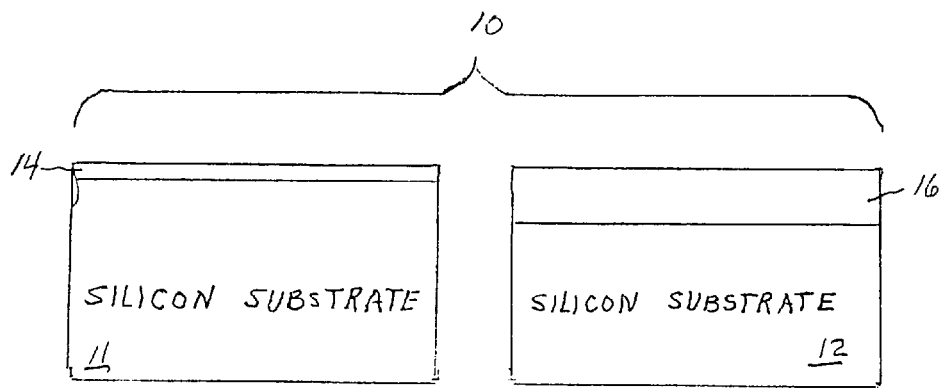
FIG. 1 is a simplified side view of a pair of semiconductor substrates illustrating an interim point in a silicon-on-insulator (SOI) fabrication process in accordance with the present invention.

Turning now to the drawings in which like reference characters indicate corresponding elements throughout the several views, attention is first directed to FIG. 1, which illustrates a simplified side view of an interim point in a fabrication process in accordance with the present invention. Illustrated in FIG. 1 is a first silicon substrate 11 and a second silicon substrate 12, which are basic components of a silicon-on-insulator (SOI) wafer 10. As will be understood from the following description, substrate 12 is referred to as the handle substrate and substrate 11 is processed to produce a thin active layer of crystalline silicon. Under normal manufacturing procedures both substrates 11 and 12 are silicon wafers, although any size substrate or portion of a wafer could be used in the following procedures, if desired, and all such substrates and portions may be referred to herein as a 'wafer' for convenience of understanding.

As shown in FIG. 1, substrate 11 has been processed to produce a layer 14 of thermal silicon dioxide ($SiO_2$) on one surface thereof and substrate 12 has been processed to produce a layer 16 of thermal silicon dioxide ($SiO_2$) on one surface. The thermal process can be any well known process and includes any steps used to produce layers 14 and 16 with a desired thickness. Here it should be noted that layer 14 is much thinner than layer 16, for purposes that will be understood from the description below. As is understood by those skilled in the art, thermal oxides grow at a regular and well known rate so that careful monitoring of the oxide formation easily grows layers that can be controlled to nanometers or even angstroms.

Figure 2:
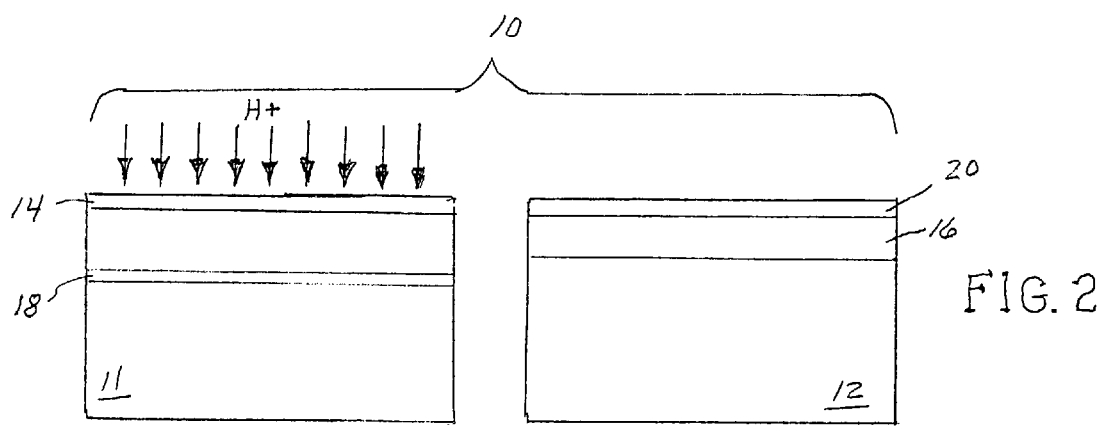
FIG. 2 is a view similar to FIG. 1 illustrating additional steps in the SOI fabrication process.

Referring to FIG. 2, hydrogen is implanted into substrate 11 to form a layer 18 spaced below layer 14 a specified distance. It will be understood by those skilled in the art that the distance layer 18 is below layer 14 is determined by the implant energy used. Also, it will be understood that the portion of substrate 11 between layers 14 and 18 will ultimately be the crystalline silicon active layer in/on which components are formed and, therefore, is generally very thin (e.g. generally in a range of 150 angstroms to 500 angstroms).

Also illustrated in FIG. 2, is a layer 20 of rare earth (RE) that is deposited on the surface of layer 16. Rare earth layer 20 can be deposited by any convenient method, such as by standard EB evaporation (commonly used to deposit metal coatings in the semiconductor industry) or the like. The rare earth in layer 20 does not form a crystalline layer but is simply a rare earth rich region or layer. While any of the materials known as 'rare earths' can be used, two preferred examples are Erbium (Er) and Ytterbium (Yb). Other typical examples of rare earth materials that can be used in this application are described in U.S. Provisional Application No. 60/533,378, filed 29 Dec. 2003, incorporated herein by reference. It should also be understood that in some specific applications it may be desirable to deposit a layer of germanium instead of the rare earth. The germanium layer is then processed as described below for the rare earth region.

Here it will be understood that in at least some applications rare earth layer 20 can be deposited on the surface of silicon dioxide layer 14, rather than the surface of silicon dioxide layer 16. However, depositing the rare earth on the thicker layer of silicon dioxide is preferred because it is believed that a more uniform insulating layer is ultimately produced.

Figure 3:
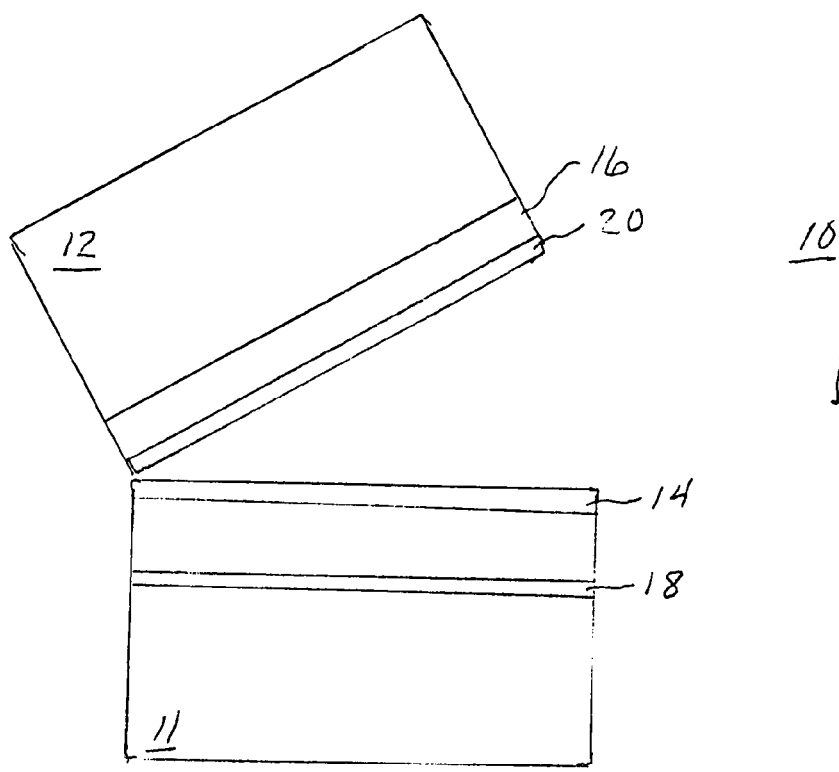
FIGS. 3, 4, 5, and 6 are additional views of the semiconductor substrates of FIG. 1 illustrating additional steps in the SOI fabrication process.
Figure 4:
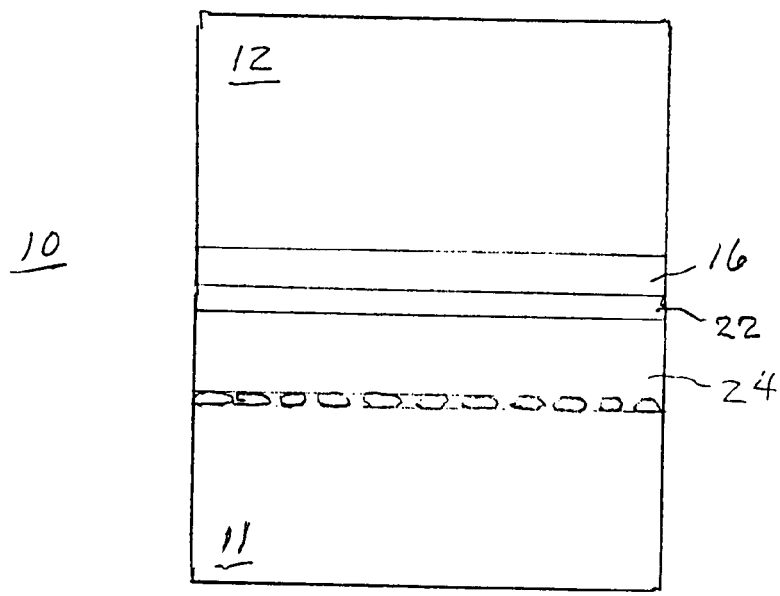

Referring additionally to FIG. 3, substrates 11 and 12 are placed in overlying relationship with the surface of rare earth layer 20 in abutting engagement with the surface of silicon dioxide layer 14. It will be understood that bringing the surfaces of layers 14 and 20 into engagement produces some natural molecular bonding, commonly referred to in the industry as Van der Waal's bonding. The combined substrates are then annealed at a temperature of approximately 1000 degrees Centigrade, which forms blistering in hydrogen layer 18, as illustrated in simplified FIG. 4. The anneal also causes the rare earth of layer 20 to interact with the silicon dioxide of layer 14 to form rare earth silicon dioxide ($RESiO_2$). The rare earth silicon dioxide forms an amorphous layer, designated 22 in FIG. 4, which is difficult to turn into a single crystal layer. However, layer 22 forms a good bond between silicon dioxide layer 16 and the crystalline silicon of substrate 11. Further, layer 22 forms a high insulating layer that resists diffusion of impurities therethrough so that impurity diffusion from the handle wafer is reduced.

Figure 5:
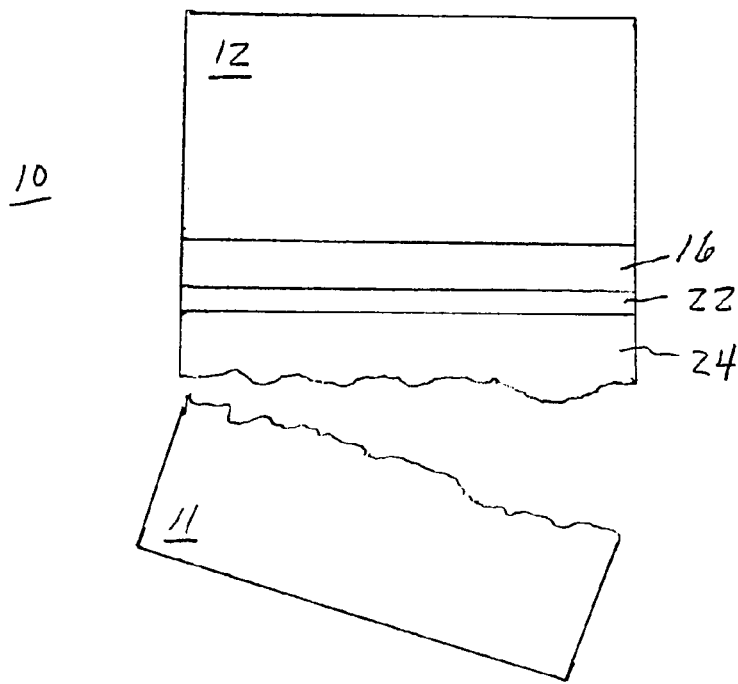
Figure 6:
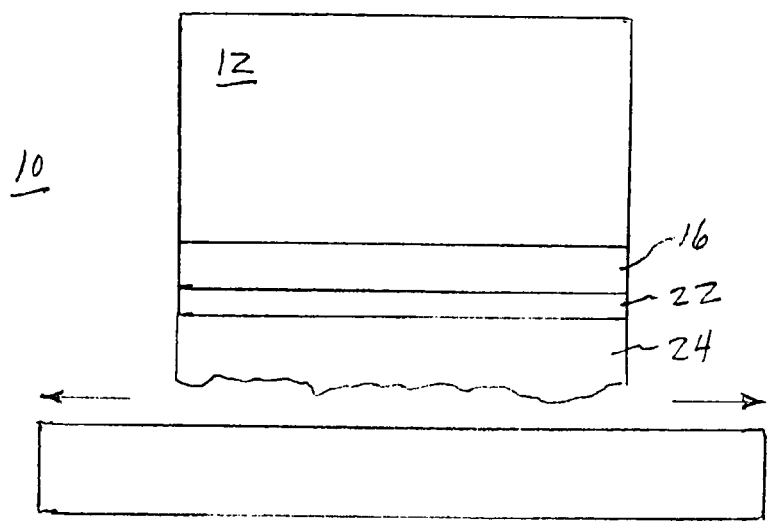
Figure 7:
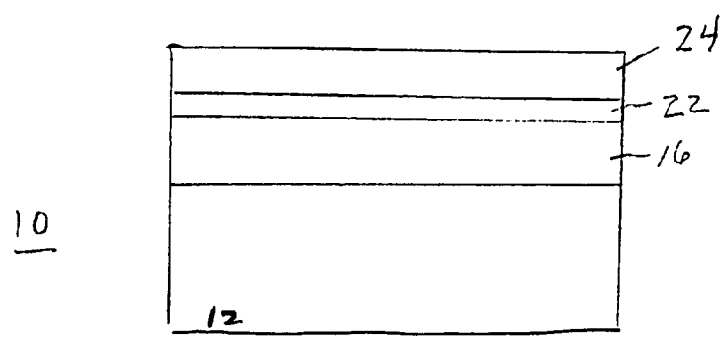
FIG. 7 is a simplified view of a semiconductor-on-insulator wafer in accordance with the present invention.

The blistering produces a weakened fracture plane, which can then be cleaved, as illustrated in FIG. 5, to remove all of substrate 11 except a portion that will become the active layer, designated 24 in FIG. 5. The surface of active layer 24 is then polished by any convenient method (e.g. CMP, which denotes chemical-mechanical-polish, generally depicted in FIG. 6) to produce thin active layer 24 with a smooth surface, as illustrated in the simplified view of FIG. 7. By including amorphous layer 22 substantially any stress in active layer 24 is eliminated, active layer 24 is freestanding (i.e. unstressed) and can, therefore be formed as thin as desired (e.g. in a range of 150 to 500 angstroms). That is, if active layer 24 were stressed by forming it only on a crystalline silicon dioxide layer it could not be treated as bulk silicon because it would be elastically deformed (i.e. strained) by the stress when the layer is too thin.

While in the embodiment described above substrate 11 is cleaved to leave thin active layer 24, it will be understood by those skilled in the art that hydrogen could be implanted in substrate 12 and substrate 12 could then be cleaved and polished to leave a thin single crystalline layer on the silicon dioxide layer 16, if desired. In this example, however, some stress would be prevalent in the active silicon layer.

Thus, new and improved semiconductor-on-insulator semiconductor wafers have been disclosed. The new and improved semiconductor-on-insulator semiconductor wafers may be used, generally, in a large variety of semiconductor products. Because insulating layer 22 can be formed very thin and because it includes higher quality insulators, such as rare earths, the wafers can be used to manufacture high quality and very small field effect transistors and the like. Also, because the insulating layer formed on the substrate ultimately resulting in the active crystalline semiconductor layer contains a rare earth, impurity diffusion from the handle wafer is reduced or eliminated so that a lower quality handle wafer can be used, thereby resulting in substantially reduced cost. Further, because stress in the active silicon layer is eliminated, the thickness and/or roughness of the active layer can be substantially reduced and the active layer contains less dislocations, defects, fractures, etc.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of fabricating a semiconductor-on-insulator semiconductor wafer comprising the steps of:
    providing a first semiconductor substrate;
    forming a first insulating layer on a surface of the first semiconductor substrate;
    providing a second semiconductor substrate;
    forming a second insulating layer on a surface of the second semiconductor substrate;
    depositing a thin layer of rare earth on one of the first insulating layer and the second insulating layer;
    positioning the thin layer of rare earth on the other of the first insulating layer and the second insulating layer to provide a combined structure and annealing the combined structure to produce a molecular reaction between the rare earth and the one of the first insulating layer and the second insulating layer; and
    removing a portion of one of the first semiconductor substrate and the second semiconductor substrate to form a thin crystalline active layer.

2. A method as claimed in claim 1 wherein the steps of providing the first semiconductor substrate and providing the second semiconductor substrate each include providing a single crystal silicon wafer.

3. A method as claimed in claim 2 wherein the step of forming the first insulating layer includes forming a first layer of silicon dioxide and the step of forming the second insulating layer includes forming a second layer of silicon dioxide.

4. A method as claimed in claim 3 wherein the step of annealing the combined wafers to produce the molecular reaction between the rare earth and the other insulating layer includes annealing to produce a layer of rare earth silicon dioxide.

5. A method as claimed in claim 3 wherein the step of depositing the thin layer of rare earth includes depositing the layer by evaporation.

6. A method as claimed in claim 3 wherein the steps of forming the first layer of silicon dioxide and forming the second layer of silicon dioxide includes forming one of the first layer of silicon dioxide and the second layer of silicon dioxide substantially thinner than the other of the first layer of silicon dioxide and the second layer of silicon dioxide.

7. A method as claimed in claim 3 wherein the steps of forming the first layer of silicon dioxide and forming the second layer of silicon dioxide includes forming the first layer of silicon dioxide substantially thinner than the second layer of silicon dioxide.

8. A method as claimed in claim 7 wherein the step of depositing the thin layer of rare earth includes depositing on the second layer of silicon dioxide.

9. A method as claimed in claim 1 wherein the step of removing the portion of one of the first semiconductor substrate and the second semiconductor substrate includes implanting a hydrogen layer in the one of the first semiconductor substrate and the second semiconductor substrate prior to annealing and cleaving the portion at the hydrogen layer subsequent to annealing.

10. A method as claimed in claim 1 wherein the step of removing the portion of one of the first semiconductor substrate and the second semiconductor substrate includes removing a portion of the first semiconductor substrate.

11. A method of fabricating a semiconductor-on-insulator semiconductor wafer comprising the steps of:
    providing a first silicon substrate;
    forming a first layer of silicon dioxide on a surface of the first silicon substrate;
    providing a second silicon substrate;
    forming a second layer of silicon dioxide on a surface of the second silicon substrate, including forming the first layer of silicon dioxide substantially thinner than the second layer of silicon dioxide;
    depositing a thin layer of rare earth on the second layer of silicon dioxide;
    positioning the thin layer of rare earth on the first layer of silicon dioxide to provide a combined structure and annealing the combined structure to produce a molecular reaction between the rare earth and the first layer of silicon dioxide so as to provide a layer of rare earth silicon dioxide; and
    removing a portion of the first silicon substrate to form a thin crystalline active layer.

12. A method as claimed in claim 11 wherein the step of removing the portion of the first silicon substrate includes implanting a hydrogen layer in the first silicon substrate prior to annealing and cleaving the portion at the hydrogen layer subsequent to annealing.

13. A method as claimed in claim 11 wherein the step of depositing the thin layer of rare earth includes depositing the layer by evaporation.

14. A semiconductor-on-insulator semiconductor wafer comprising:
    a first silicon substrate;
    a silicon dioxide layer on a surface of the first silicon substrate;
    a second silicon substrate;
    a rare earth silicon dioxide layer on a surface of the second silicon substrate;
    the silicon dioxide layer being bonded to the rare earth silicon dioxide layer, thereby bonding the first silicon substrate to the second silicon substrate; and
    a portion of one of the first silicon substrate and the second silicon substrate being removed to form a thin crystalline active layer on one of the silicon dioxide layer and the rare earth silicon dioxide layer.

15. A semiconductor-on-insulator semiconductor wafer as claimed in claim 14 wherein the silicon dioxide layer is substantially thicker than the rare earth silicon dioxide layer.

16. A semiconductor-on-insulator semiconductor wafer as claimed in claim 14 wherein the second silicon substrate is partially removed to provide a thin crystalline active layer on the rare earth silicon dioxide layer.

17. A semiconductor-on-insulator semiconductor wafer as claimed in claim 14 wherein the thin crystalline active layer is in a range of 150 angstroms to 500 angstroms thick.

18. A semiconductor-on-insulator semiconductor wafer as claimed in claim 14 wherein the rare earth silicon dioxide layer is amorphous.

* * * * *